(12) United States Patent
Kuit et al.

(10) Patent No.: US 7,106,420 B2
(45) Date of Patent: Sep. 12, 2006

(54) LITHOGRAPHIC APPARATUS AND DEVICE MANUFACTURING METHOD

(75) Inventors: Jan Jaap Kuit, Veldhoven (NL); Dirk Jan Bijvoet, Eindhoven (NL); Jan Frederik Hoogkamp, Breda (NL); Hubert Marie Segers, 's-Hertogenbosch (NL); Raimond Visser, Best (NL); Johannes Maquine, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 5 days.

(21) Appl. No.: 11/015,763

(22) Filed: Dec. 20, 2004

(65) Prior Publication Data

US 2006/0066833 A1 Mar. 30, 2006

Related U.S. Application Data

(63) Continuation-in-part of application No. 10/950,674, filed on Sep. 28, 2004, and a continuation-in-part of application No. 10/969,244, filed on Oct. 21, 2004.

(51) Int. Cl.
*G03B 27/58* (2006.01)
(52) U.S. Cl. ........................................ 355/72
(58) Field of Classification Search ............ 355/72
See application file for complete search history.

(56) References Cited

U.S. PATENT DOCUMENTS 4,886,412 A * 12/1989 Wooding et al. ....... 414/416.05

2004/0075822 A1 * 4/2004 Hattori ..................... 355/72
2005/0057733 A1 * 3/2005 Owen et al. ............... 355/30
2005/0058446 A1 * 3/2005 Plug ........................ 396/611
2005/0073667 A1 * 4/2005 An et al. .................... 355/72

* cited by examiner

Primary Examiner—W. B. Perkey
Assistant Examiner—Vivian Nelson
(74) Attorney, Agent, or Firm—Pillsbury Winthrop Shaw Pittman, LLP (57) ABSTRACT

The present invention relates to a lithographic apparatus including a projection system configured to project a patterned radiation beam onto a target portion of a substrate held on a substrate support, the patterned beam of radiation being patterned with a patterning device held by a patterning device support. The lithographic apparatus includes an exchangeable object handling apparatus for exchanging an exchangeable object with a exchangeable object station and a support, the exchangeable object being one of the substrate and the patterning device and the support being one of the substrate support and the patterning device support, the exchangeable object handling apparatus including an intermediate holding device for holding an exchangeable object, which intermediate holding device can interact with the support to place an exchangeable object on or take an exchangeable object from the support, and a robot which can exchange an exchangeable object with the support, the intermediate holding device and said exchangeable object station.

35 Claims, 4 Drawing Sheets

LITHOGRAPHIC APPARATUS AND DEVICE MANUFACTURING METHOD

PRIORITY INFORMATION

This application is a Continuation-In-Part of U.S. patent application Ser. No. 10/950,674 entitled "Lithographic Apparatus and Device Manufacturing Method", filed on Sep. 28, 2004, and of U.S. patent application Ser. No. 10/969,244 entitled "Lithographic Apparatus and Device Manufacturing Method", filed on Oct. 21, 2004. The content of those applications are incorporated herein in their entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that circumstance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In conventional lithographic apparatus of the above-mentioned type an exchangeable object handling apparatus may be used for the exchange of exchangeable objects between a stationary exchangeable object station and an exchangeable object support on which the exchangeable object during an operational phase is supported. Such exchangeable object may be a substrate which is exchanged between a substrate station and a substrate support, such as a substrate table on which the substrate is supported during the transfer of a pattern on the substrate. The exchangeable object may also be a patterning device which is exchanged between a patterning device loading station and a patterning device support on which during an operational phase the patterning device is supported.

Production capacity of a lithographic apparatus is, in part, affected by the exchange time needed to take away, after illumination, a substrate, which is located on the substrate support, and to place another substrate on the substrate support for a subsequent illumination. In order to increase the capacity of the lithographic apparatus it is desirable to decrease this exchange time.

In order to keep the exchange time small, the substrate handling apparatus of a conventional lithographic apparatus includes a robot with a double end-effector, i.e. robot capable of holding at the same time two substrates in two different holding positions. The double end-effector can be rotated around its vertical axis so that one of the two holding positions can be turned to a position wherein the robot can exchange a substrate with the substrate support. In another position, usually when the double end-effector is rotated over 180 degrees, a substrate in the other of the two holding positions can be exchanged with the substrate support.

When a first substrate held in the substrate support is to be exchanged by a second substrate which is placed in a loading station, the second substrate can during the transfer of a pattern on the first substrate, be placed in one of the holding positions of the robot. When the transfer is finished, the first substrate is taken from the substrate support in the other one of the holding positions of the robot. After that the double end-effector is rotated the second substrate is placed on the substrate support. Subsequently a pattern can be transferred on that second substrate. During this pattern transfer the robot can place the first substrate in the loading station. As the robot can hold two substrates at the same time the robot with double end-effector makes a relative quick exchange of the first and second substrate possible.

However, in conventional substrate handling apparatus, the robot with double end-effector is a relative expensive part of the lithographic apparatus, also due to the space needed to make the movement of the robot and in particular the rotating movement of the double end-effector in the lithographic apparatus in the proximity of the substrate support possible.

Alternatively, two robots which each can exchange an exchangeable object with a stationary station and the support may be provided. However, this solution may be expensive and may require a lot of footprint.

SUMMARY

It is desirable to provide a lithographic apparatus including an improved exchangeable object handling apparatus for exchanging an exchangeable object, whereby the improved exchangeable object handling apparatus provides for an efficient change of exchangeable objects.

According to an embodiment of the invention, there is provided a lithographic apparatus including an illumination system configured to condition a radiation beam, a patterning device support constructed to support a patterning device, the patterning device being capable of imparting the radiation beam with a pattern in its cross-section to form a patterned radiation beam, a substrate support constructed to hold a substrate, a projection system configured to project the patterned radiation beam onto a target portion of the substrate, and an exchangeable object handling apparatus for exchanging an exchangeable object with an exchangeable object station and a support, the exchangeable object handling apparatus including an intermediate holding device and a manipulator, each being designed to hold an exchangeable object, wherein the intermediate holding device is capable of exchanging an exchangeable object with the manipulator, wherein the manipulator is capable of exchanging an exchangeable object with the support, the intermediate holding device and the exchangeable object station, and wherein the intermediate holding device is positioned substantially closer to the support than the exchangeable object station.

According to another embodiment of the invention, there is provided a device manufacturing method including the steps of projecting, in an operational phase, a pattern from a patterning device placed on a patterning device support onto a substrate placed on a substrate support, and exchanging, in an exchanging phase, an exchangeable object between a support and an exchangeable object station by using a manipulator and an intermediate holding device, the intermediate holding device being positioned substantially closer to the support than the exchangeable object station, the manipulator being capable of exchanging an exchangeable object with the exchangeable object station, the support and the intermediate holding device, and the intermediate holding device being capable of exchanging an exchangeable object with the manipulator, wherein during exchange an exchangeable object is temporarily stored in the intermediate holding device.

In an embodiment of the invention, there is provided a lithographic apparatus including (a) an illumination system configured to condition a radiation beam; (b) a patterning device support configured to support a patterning device, the patterning device configured to pattern the beam of radiation to a form a patterned beam of radiation; (c) a substrate support configured to hold a substrate; (d) a projection system configured to project the patterned radiation beam onto the substrate, and (e) an exchangeable object handling apparatus configured to exchange an exchangeable object with one of the supports, said exchangeable object handling apparatus including (i) a manipulator; and (ii) an intermediate holding device, wherein the manipulator is configured to exchange the exchangeable object with the one support, the intermediate holding device and an exchangeable object station, and wherein the intermediate holding device is positioned substantially closer to the support than the exchangeable object station.

In yet another embodiment of the invention, there is provided an exchangeable object handling apparatus configured to exchange an exchangeable object on a support in a lithographic apparatus, the exchangeable object handling apparatus including a manipulator; and an intermediate holding device, wherein the manipulator is configured to exchange the exchangeable object with the support, the intermediate holding device and an exchangeable object station, and wherein the intermediate holding device is positioned substantially closer to the support than the exchangeable object station.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
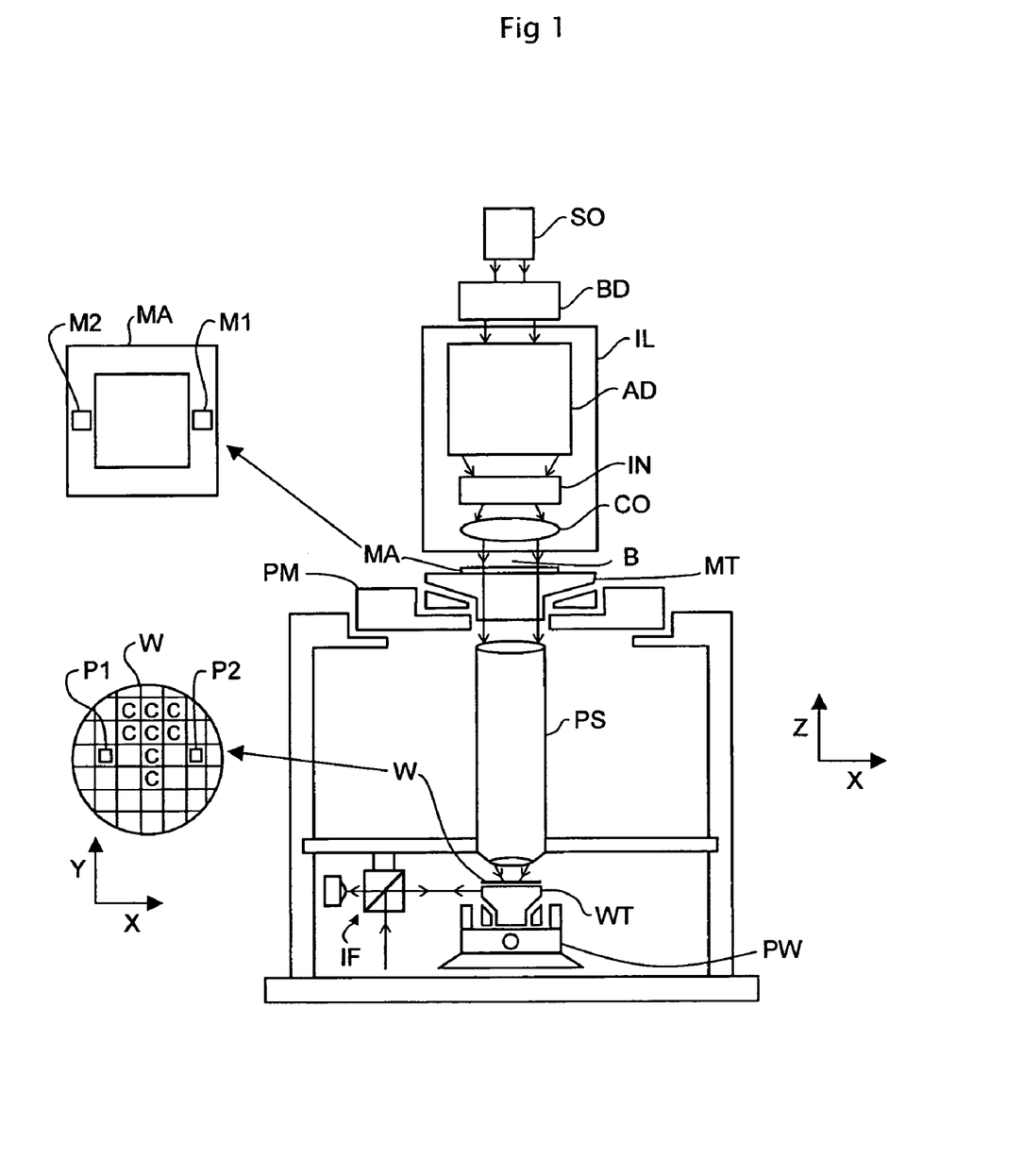
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or other types of radiation), and a support structure (e.g. a mask table) MT constructed to support a patterning device (e.g. a mask) MA and connected to a first positioner PM configured to accurately position the patterning device in accordance with certain parameters. The apparatus also includes a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
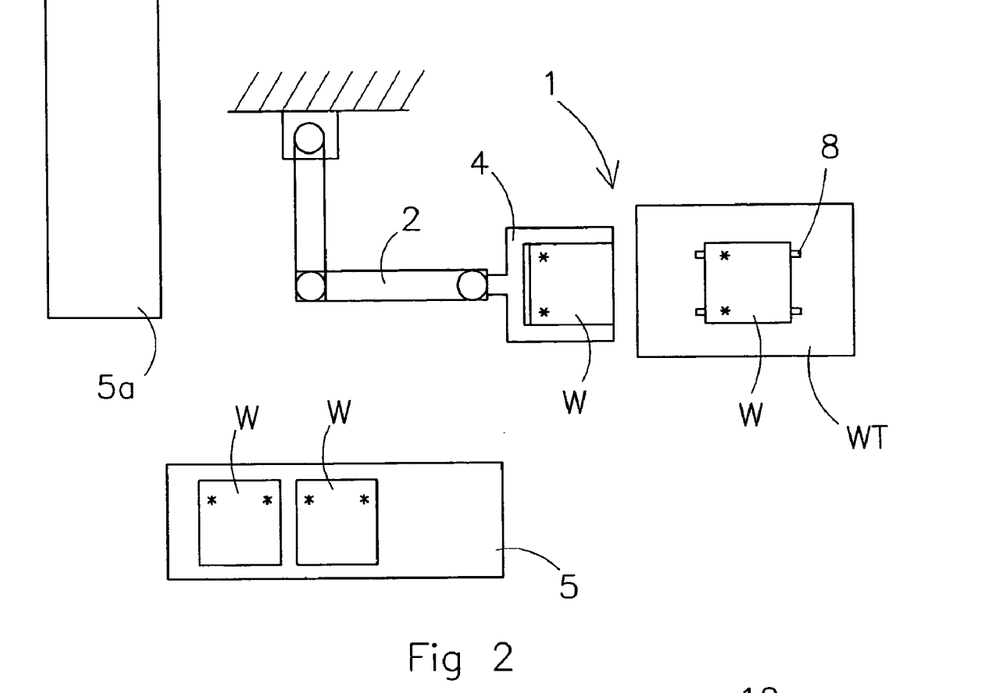
FIG. 2 depicts a top view of a substrate handling apparatus according to an embodiment of the invention.
Figure 3:
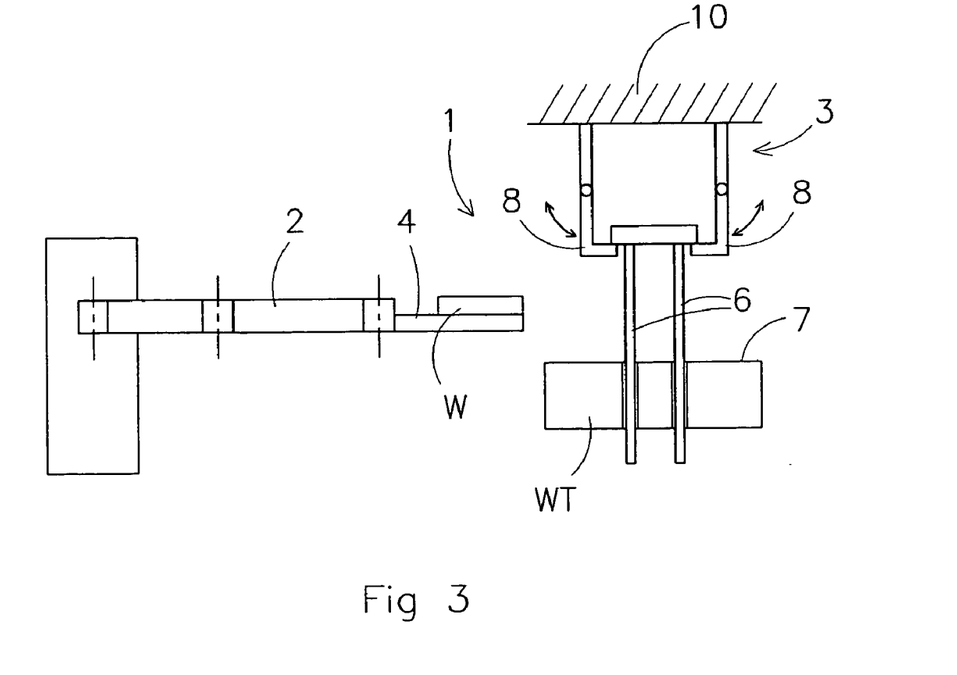
FIG. 3 depicts a side view of the substrate handling apparatus of FIG. 2.

FIGS. 2 and 3 show an embodiment of a substrate handling apparatus which in general is indicated with the reference number 1. The substrate handling apparatus 1 includes a robot 2 and an intermediate holding device 3 configured to temporarily hold one substrate W. The robot 2 includes a single end-effector 4 which can hold one substrate W at the same time. The robot 2 can exchange a substrate W with a loading station 5, the substrate support (or substrate table) WT and the intermediate holding device 3. The exchange between the robot 2 and the support WT takes place in a first take-over area or first take-over region and the exchange between the robot 2 and the intermediate holding device 3 takes place in a second take-over area or second take-over region. It will be appreciated that in embodiments of the invention, a take-over region broadly refers to a region in the space where a take-over is performed.

The end-effector 4 of the robot 2 can be designed as any suitable gripping device that can hold a substrate W and may, for example, include mechanical, vacuum, electromechanical or electrostatic gripping devices.

In general any suitable manipulator can be used to exchange the substrate W between the loading station 5, the intermediate holding device 3 and the support WT. The robot 2 of FIGS. 2 and 3 may be a multi-axis robot which in an efficient way can move the substrate W to the substrate support WT, the intermediate holding device 3, and the respective loading station 5. A robot is defined as a manipulator including two or more arms, the two or more arms being movably, for example, rotatably connected to each other, whereby at least one end of the robot is designed to manipulate an object within a certain space.

The loading station 5 is a stationary station, such as for example, an exchangeable box commonly used in the chip producing industry, and holds a number of substrates W which may be transferred by the robot 2, directly or via the intermediate holding device 3, to the substrate support WT. The robot 1 may also be suitable for exchanging a substrate W with any other station 5a such as an inspection station, buffer station or a cleaning station. When a substrate W is directly transferred from such other station 5a to the substrate support WT or the intermediate holding device 3 (and thus not via the loading station 5), this other station 5a is also regarded to be a loading station in the context of this application.

The intermediate holding device 3 can interact with the substrate support WT to place a substrate W on or take a substrate W from the substrate support WT, and can interact with the robot 2 to exchange a substrate W with the robot 2. The exchange between the intermediate holding device 3 and the substrate support WT takes place in a third take-over area or third take-over region.

The intermediate holding device 3 is located above an exchange position of the substrate support WT in which the substrate support WT is placed for the exchange of a substrate W. During the operational phase of the lithographic apparatus the substrate support WT may be moved, whereby it is possible that the intermediate holding device 3 is not anymore located above the substrate support WT. In an embodiment of the invention, the intermediate holding device 3 is mounted on a substantially vibration-isolated frame 10 so that the chance on take-over errors is reduced.

The intermediate holding device 3 may be located substantially closer to the substrate support WT in the exchange position (i.e. the position of the substrate support WT in which it is located during an exchange of a substrate W with said robot 2 or with said intermediate device 3) than the loading station 5. With substantially closer to the substrate support WT is meant that the distance between the intermediate holding device 3 and the substrate support WT in the exchange position is less than half, or may be less than a quarter of the distance between the substrate support WT and the loading station 5.

It is however remarked that when an intermediate holding device 3 can directly exchange a substrate W with the substrate support WT it is not necessarily required that the intermediate holding device 3 be located substantially closer to the substrate support WT in the exchange position than the loading station 5.

The interaction between the intermediate holding device 3 and the substrate support WT is in the embodiment of FIGS. 2 and 3 obtained by a lifting device 6 which is provided in the substrate support WT. This lifting device, which, for example, may be designed as a lifting pin-mechanism, which is often referred to as "e-pins", can lift a substrate W from the support surface 7 of the substrate support WT to the third take-over area or third take-over region where the intermediate holding device 3 can take the substrate W from the lifting device 6. In this same third take-over area or third take-over region the intermediate holding device 3 may place a substrate W on the lifting device 6 after which the substrate W can be lowered by retracting the lifting device 6 and be placed on the substrate support WT. In the embodiment of the invention shown in FIG. 6, the third take-over region is the region where the intermediate holding device 3 takes the substrate W from the lifting device 6

The lifting device 6 may also be lifted to the first take-over area or first take-over region in which the robot 2 can exchange a substrate W with the substrate support WT. The position of the lifting device 6 wherein the lifting device 6 is retracted in the substrate support WT is in this application also referred to as retracted position. In this retracted position, a substrate W placed on the substrate support is supported on a support surface 7 of this substrate support WT. In FIG. 3, the first take-over region may be the region above the wafer table that is located at substantially a same height of the wafer W placed on the manipulator.

The intermediate holding device 3 may include any gripping device 8 that is suitable to hold the substrate W and may, for example, include mechanical, vacuum, electromechanical or electrostatic gripping devices. In the embodiment of FIGS. 2 and 3 the gripping device 8 includes pivotable arms which can be moved in the direction as indicated by the arrows. When the lifting device 6 moves a substrate upwards from the support surface 7 of the substrate support WT to the intermediate holding device 3 (i.e. the third take-over area or third take-over region), the pivotable arms are moved outwardly so that the substrate can be moved to a position above the position wherein the substrate is shown in FIG. 2. Subsequently, the pivotable arms are moved back to their initial positions and the lifting device 6 is retracted so that the substrate comes to rest on the pivotable arms as shown in FIG. 2.

In an alternative embodiment, the arms of the gripping device 8 are static and arranged in such a way that in a sideways direction (i.e. with a substantial horizontal movement) a substrate W can be brought in a position above the supporting parts of the arms 8. In such embodiment, the lifting device 6 may move the substrate W to be exchanged to the same height as this position before or during that the substrate support WT is moved from the operational position to the exchange position. When the substrate support WT is moved into the exchange position the substrate is more or less slid into the gripping device 8. When the substrate support WT is in the exchange position the lifting device 6 can be retracted so that the substrate W comes to rest on the arms of the gripping device 8. In a reverse order a substrate W can be taken out of the intermediate holding device 3. In a similar way, with a substantially horizontal movement, the robot 2 may exchange a substrate W with the intermediate holding device 3. In this alternative embodiment any suitable static holding device may be used to hold the substrate W, which holding device 3 allows a sideways introduction of the substrate by the support WT and the robot 2.

When, in the embodiment of FIGS. 2 and 3, a first substrate W on the substrate support WT is to be replaced by a second substrate W that is placed in the loading station 5 the following acts can be followed with the substrate handling apparatus 1. First the robot 2 takes the second substrate W out of the loading station 5. This act may be taken during the operational phase of the lithographic apparatus in which a pattern from a patterning device is transferred to the first substrate W which is located on the substrate support WT in which case the operational phase and the exchanging phase overlap. After or during this act, but in any case after the operational phase, the substrate W is lifted from the support surface 7 of the support WT by the lifting device 6 to the third take-over area or third take-over region, so that the intermediate holding device 3 is able to take the first substrate W from the substrate support WT. Thereafter the robot places in the first take-over area or first take-over region the second substrate W on the lifting device 6 for which it may be needed that the lifting device is lowered over a certain distance to the first take-over area or first take-over region. When the second substrate W is placed on the lifting device 6 the lifting device 6 is lowered to the retracted position to place the second substrate W on the support surface 7 after which the operational phase with respect to the second substrate W may begin. The first substrate W which is held in the intermediate holding device 3 is in the second take-over area or second take-over region taken out of the intermediate holding device 3 by the robot 2 which transfers it consequently to the substrate loading station 5. In the embodiment of FIGS. 2 and 3 the first take-over area or first take-over region is located at a lower height than the second and third take-over area or second and third take-over region, while the second and third take-over area or the second and third take-over region substantially overlap. In other embodiments the first, second and/or third take-over area may (at least partially) overlap, but also may include different areas depending on the arrangement and functioning of the robot 2, the intermediate holding device 3 and the substrate support WT.

Instead of the method described above, it is also possible that the robot 2 takes in the first act the second substrate W out of the loading station 5 and places it in the intermediate holding device 3 before the operational phase has ended. Thereafter, the robot 2 may take the first substrate W from the substrate support WT after which the second substrate W may be placed on the substrate support WT by the intermediate holding device 3.

In both methods the intermediate holding device 3 holds temporarily one of the substrates W1, W2 to be exchanged in order to make an efficient exchange of the substrates W possible. The intermediate holding device 3 does not interact with the loading station 5 and holds maximal one substrate W at the same time. For this reason the intermediate holding device 3 may be of a relative simple design and is therefore relatively cheap. The presence of the intermediate holding device 3 makes it thus possible to quickly exchange a substrate W for another without the need for two robots or a relatively expensive robot with a double end-effector.

In the methods as described above it was assumed that at the beginning of the different acts of the method a substrate was present on the substrate support, which was to be exchanged with another substrate which was present in the loading station. This mode of exchange may be described as the input/output mode.

In general, three different types of exchange modes can be distinguished. In the input mode, a substrate is transferred from the loading station to the substrate support, whereby initially no substrate is present on the substrate support. In the output mode a substrate is transferred from the substrate support to the loading station, while no substrate is transferred from the loading station to the substrate support. As in both the input and the output mode only one substrate is exchanged there is no need to use the intermediate holding device during the exchange.

In an embodiment, the lithographic apparatus includes two or more intermediate holding devices each capable of holding one or more substrates. The input and output modes can in such embodiment be used to place a number of substrates on or take a number of substrates from the intermediate holding device, respectively (in that case the substrates are not transferred from or to the substrate support, but to or from the intermediate holding device).

During use of the lithographic apparatus the three different modes can be used in any suitable order. The application of any of these three modes in a lithographic apparatus with an intermediate holding device is deemed to fall within the scope of the invention.

Figure 4:
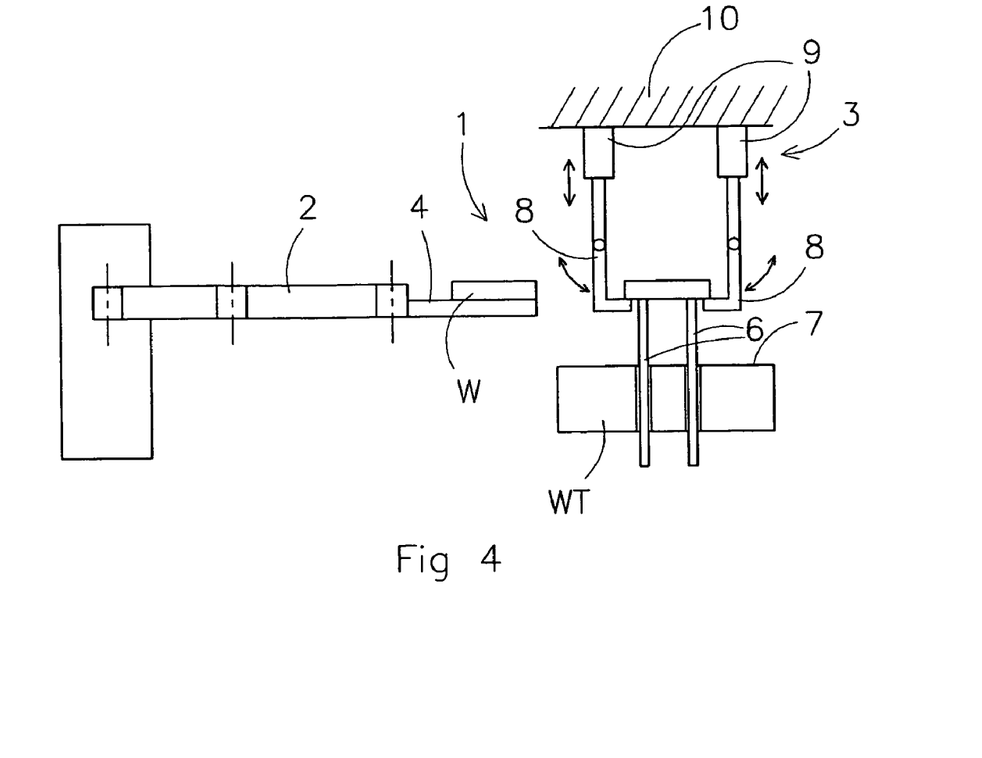
FIG. 4 depicts a substrate handling apparatus according to an alternative embodiment of the invention.

In FIG. 4 an alternative embodiment of the substrate handling apparatus 1 is shown. In this embodiment the lifting device 6 of the substrate support WT may lift the substrate W to the first take-over area or first take-over region wherein the robot 2 can exchange a substrate W with the substrate support WT. The gripping devices 8 of the intermediate holding device 3 are movable in a vertical direction using actuators 9 between a robot exchange position, making possible an exchange in the second take-over area or second take-over region, and a support exchange position, making possible an exchange in the third take-over area or third take-over region. In the support exchange position, in which position the intermediate holding device 3 is shown in FIG. 4, the intermediate holding device 3 can exchange a substrate W with the lifting device 6 of the substrate support WT in the above-mentioned third take-over area or third take-over region. In the robot exchange position, the intermediate holding device 3 can exchange a substrate W with the robot 2 in the second take-over area or second take-over region. The support exchange position is in the substrate handling apparatus 1 of FIG. 4 located at a lower height than the robot exchange position, so that when the intermediate holding device 3 is in the latter position the robot 2 can be placed between the intermediate holding device 3 and the substrate support WT to make an exchange between the robot 2 and the substrate support WT and between the robot 2 and the intermediate holding device 3 possible.

In an alternative embodiment, it is possible to use an intermediate holding device 3, which can move vertically towards the substrate support WT so that substrate W can be taken directly from the support surface 7 of the substrate support WT without the use of a lifting system. In such embodiment of the substrate handling apparatus, the robot may place a substrate W on or take a substrate W from the substrate support WT without the substrate W being lifted from the substrate support WT by a lifting device. In yet another embodiment, it is also possible that instead of lifting device 6 the substrate support WT can be moved in a vertical direction to the first and the third take-over area or first and third take-over region. In this embodiment the intermediate holding device 3 may not have to be movable in a vertical direction.

In the above description a number of embodiments of a substrate handling apparatus have been described. Such apparatus could also be used for the exchange of patterning devices between the patterning device support (mask table) and a patterning device loading station, or to exchange any other exchangeable object which is applied in a lithographic apparatus, such as an exchangeable object used in the optical path of the lithographic apparatus. Such exchangeable object handling apparatus for the exchange of a substrate, patterning device or any other exchangeable object used in a lithographic apparatus is deemed to fall within the scope of the present application.

Figure 5:
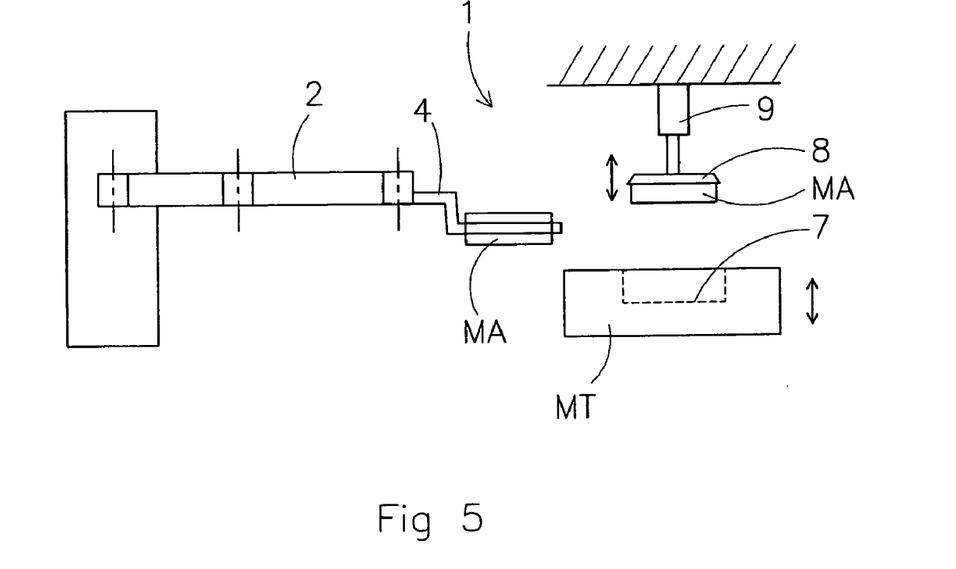
FIG. 5 depicts a patterning device handling apparatus according to an embodiment of the invention.
Figure 6:
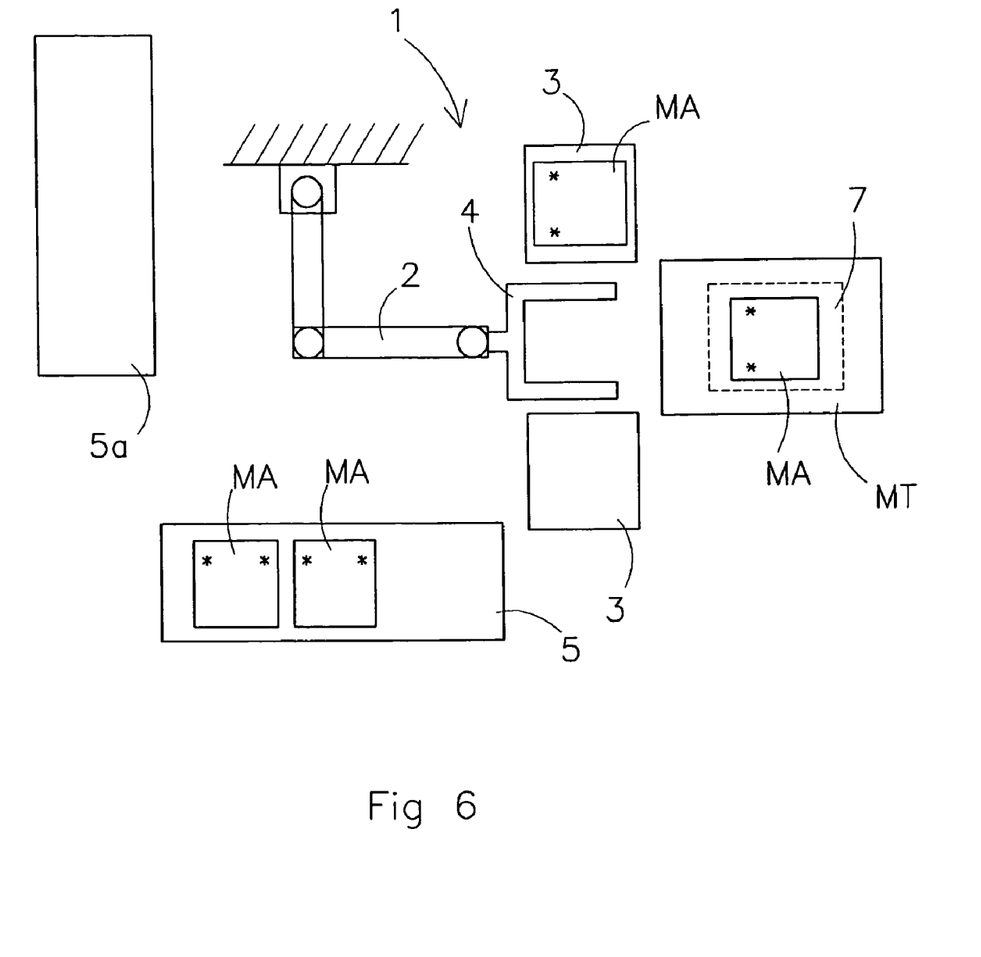
FIG. 6 depicts a patterning device handling apparatus according to an embodiment of the invention.

Examples of a patterning device handling apparatus are shown in FIG. 5 and FIG. 6. In FIG. 5 the patterning device handling apparatus 1 includes a robot 2 with an end-effector 4 for holding one patterning device, and an intermediate holding device 3 which can hold a patterning device MA, for example by a mechanical, vacuum, electrostatic or electromagnetic gripping device 8. The intermediate holding device 3 is mounted on a substantially vibration-isolated frame (also referred to as "metro-frame") and includes an actuator 9 to move the gripping device 8 of the intermediate holding device 3 in a vertical direction. Due to this vertical movement the intermediate holding device 3 can directly place a patterning device MA on or take a patterning device MA from the support surface 7 the patterning device support MT.

In the embodiment of FIG. 5, it may also be possible that the patterning device support is movable in a vertical direction as indicated by the arrow (at the right side of the patterning device support MT). Depending on the vertical movement of the gripping device 8 and/or the patterning device support MT the third take-over area or third take-over region is situated where the patterning device is exchanged between the intermediate holding device 8 and the patterning device support MT. The first and/or second take-over area or first and/or second take-over region may in this embodiment overlap with the third take-over area or third take-over region.

In FIG. 6, another patterning device handling apparatus is shown. The patterning device handling apparatus 1 includes a robot 2 with a single end-effector 4 capable of holding one patterning device MA and two intermediate holding devices 3 each capable of holding one patterning device MA. The two intermediate holding devices 3 are located substantially closer to the patterning device support in the exchange position than the loading station 5. With substantially closer to the patterning device support is meant that the distance between each of the intermediate holding devices 3 and the patterning device support MT in the exchange position is less than half, or may be less than a quarter of the distance between the patterning device support MT and the loading station 5.

The two intermediate holding devices 3 can not directly exchange a patterning device with the patterning device support MT. The robot 2 can exchange a patterning device between the loading station 5, the intermediate holding devices 3 and the patterning device support MT.

A first patterning device on the patterning device support can be exchanged by a second patterning device present in the loading station 5 using the following method. During the operational phase, i.e. when a pattern of the first patterning device MA supported on the patterning device support is transferred to a substrate, the robot can take the second patterning device MA out of the loading station 5 and place it on one of the intermediate holding devices 3. After the operational phase the robot 2 takes the first patterning device MA from the patterning device support MT and places it on the other of the two intermediate holding devices 3, after which the robot 2 takes the second patterning device MA and places it on the patterning device support MT. Now, in a new operational phase the illumination of a substrate can be started using the pattern of the second patterning device MA. In the mean time, the robot 2 can take the first patterning device from the intermediate holding device and place it in the loading station 5.

Since the intermediate holding devices 3 are located close to the patterning device support MT the time needed for the exchange of the first and second patterning devices MA is relatively small, while at the same time a robot 2 with a single end-effector 4 is used, which reduces the costs and the space needed for the robot when compared to a robot with a double end-effector.

In an alternative embodiment there may also be provided one intermediate holding device capable of holding at least two patterning devices. In other embodiments, the intermediate holding device is only capable of holding two patterning devices MA at the same time, or there are provided two intermediate holding devices each capable of holding one patterning device MA. In this way a minimum of space is required to temporarily hold the patterning devices MA.

In the above-described embodiments of the substrate handling apparatus the support plane of a substrate W present on the substrate support WT was horizontal, whereby the support plane is defined as the plane in which the bottom side of the substrate W is lying when it is supported on the substrate support WT. In some known substrate supports WT this support plane is not horizontal but another direction for instance vertical or slanting. In such embodiments the location of the intermediate holding device would not be defined as above but rather as perpendicular to the support plane. Terms as higher and lower should in such a case be understood as further or closer spaced with respect to the support plane in this direction perpendicular to the support plane.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV)

radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   (a) an illumination system;
   (b) a projection system configured to project a patterned radiation beam;
   (c) an exchangeable object station configured to hold an exchangeable object;
   (d) a support constructed to support an exchangeable object that is used during projection; and,
   (e) an exchangeable object handling apparatus including
      (i) a manipulator; and
      (ii) an intermediate holding device,
   wherein said manipulator and said intermediate holding device are each configured to hold the exchangeable object,
   wherein said manipulator is configured to exchange the exchangeable object between said support, said intermediate holding device and said exchangeable object station,
   wherein said intermediate holding device is configured to exchange the exchangeable object with said manipulator, and
   wherein said intermediate holding device is positioned substantially closer to said support than said exchangeable object station.

2. The lithographic apparatus of claim 1, wherein said intermediate holding device is configured to exchange an exchangeable object with said support.

3. The lithographic apparatus of claim 2, wherein said exchangeable object handling apparatus is configured to exchange an exchangeable object between said intermediate holding device and said support in a third take-over region.

4. The lithographic apparatus of claim 3, wherein said third take-over region is positioned above a first take-over region where an exchangeable object is exchanged between said manipulator and said support.

5. The lithographic apparatus of claim 3, wherein said third take-over region substantially overlaps a second take-over region where an exchangeable object is exchanged between said intermediate holding device and said manipulator.

6. The lithographic apparatus of claim 3, wherein said support comprises a lifting device configured to lift an exchangeable object from a support surface of said support to said third take-over region.

7. The lithographic apparatus of claim 3, wherein said intermediate holding device is movable to said third take-over region.

8. The lithographic apparatus of claim 3, wherein said support is movable to said third take-over region.

9. The lithographic apparatus of claim 1, wherein said manipulator comprises a single end-effector that is configured to hold one exchangeable object.

10. The lithographic apparatus of claim 1, wherein said intermediate holding device comprises a single gripping device configured to hold one exchangeable object.

11. The lithographic apparatus of claim 1, wherein said exchangeable object handling apparatus includes two or more intermediate holding devices that are each configured to hold an exchangeable object.

12. The lithographic apparatus of claim 1, wherein said intermediate holding device is stationary.

13. The lithographic apparatus of claim 1, wherein said exchangeable object handling apparatus is configured to exchange an exchangeable object between said manipulator and said support in a first take-over region and to exchange an exchangeable object between said intermediate holding device and said manipulator in a second take-over region.

14. The lithographic apparatus of claim 13, wherein said second region is positioned above said first take-over region.

15. The lithographic apparatus of claim 13, wherein said support comprises a lifting device configured to lift an exchangeable object from a support surface of said support to said first take-over region.

16. The lithographic apparatus of claim 15, wherein said lifting device is movable in a direction substantially perpendicular to said support surface of the support.

17. The lithographic apparatus of claim 13, wherein said intermediate holding device is movable to said second take-over region.

18. The lithographic apparatus of claim 17, wherein said intermediate holding device is movable in a direction substantially perpendicular to a support surface of the support.

19. The lithographic apparatus of claim 13, wherein said support is movable to said first take-over region.

20. The lithographic apparatus of claim 19, wherein said support is movable in a direction substantially perpendicular to a support surface of the support.

21. The lithographic apparatus of claim 1, wherein said intermediate holding device is mounted on a substantially vibration-isolated frame.

22. The lithographic apparatus of claim 1, wherein the exchangeable object is a substrate on which said patterned radiation beam is projected, and said support is a substrate support constructed to hold said substrate.

23. The lithographic apparatus of claim 1, wherein the exchangeable object is a patterning device, the patterning device being capable of imparting the radiation beam with a pattern in its cross-section to form said patterned radiation beam and wherein said support is a patterning device support constructed to support said patterning device.

24. The lithographic apparatus of claim 1, further comprising another exchangeable object handling apparatus configured to exchange another exchangeable object that is used during projection with another support such that both said exchangeable object handling apparatus and said other exchangeable object handling apparatus each include a manipulator and an intermediate holding device.

25. A device manufacturing method comprising:
   projecting a pattern from a patterning device placed on a patterning device support onto a substrate placed on a substrate support, and exchanging an exchangeable object between one of said supports and an exchangeable object station by using a manipulator and an intermediate holding device, said intermediate holding device being positioned substantially closer to said one support than said exchangeable object station, said manipulator being configured to exchange said exchangeable object with said exchangeable object station, said one support and said intermediate holding device, and said intermediate holding device being configured to exchange said exchangeable object with said manipulator, wherein during exchange said exchangeable object is temporarily stored in said intermediate holding device.

26. The method of claim 25, comprising replacing a first exchangeable object on said one support by a second exchangeable object located in said exchangeable object station, the replacing comprising:
using said manipulator to take said second exchangeable object from said exchangeable object station;
using said intermediate holding device to take said first exchangeable object from said one support;
using said manipulator to place said second exchangeable object on said one support,
using said manipulator to take said first exchangeable object from said intermediate holding device, and
using said manipulator to place said first exchangeable object in said exchangeable object station.

27. The method of claim 25, further comprising replacing a first exchangeable object on said one support by a second exchangeable object located in said exchangeable object station, the replacing comprising:
using said manipulator to take said second exchangeable object from said exchangeable object station;
using said manipulator to place said second exchangeable object in said intermediate holding device;
using said manipulator to take said first exchangeable object from said support;
using said intermediate holding device to place said second exchangeable object on said support, and
using said manipulator to place said first exchangeable object in said exchangeable object station.

28. The method of claim 25, wherein said exchangeable object is said substrate and said one support is said substrate support.

29. The method of claim 25, wherein said exchangeable object is said patterning device and said one support is said patterning device support.

30. A lithographic apparatus comprising:
(a) an illumination system configured to condition a radiation beam;
(b) a patterning device support configured to support a patterning device, the patterning device configured to pattern the beam of radiation to a form a patterned beam of radiation;
(c) a substrate support configured to hold a substrate;
(d) a projection system configured to project the patterned radiation beam onto the substrate, and
(e) an exchangeable object handling apparatus configured to exchange an exchangeable object with one of said supports, said exchangeable object handling apparatus including
(i) a manipulator; and
(ii) an intermediate holding device,
wherein said manipulator is configured to exchange said exchangeable object with said one support, said intermediate holding device and an exchangeable object station, and
wherein said intermediate holding device is positioned substantially closer to said support than said exchangeable object station.

31. The lithographic apparatus of claim 30, wherein said exchangeable object is said substrate and said one support is said substrate support.

32. The lithographic apparatus of claim 30, wherein said exchangeable object is said patterning device and said one support is said patterning device support.

33. The lithographic apparatus of claim 30, further comprising an additional exchangeable object handling apparatus configured to exchange an exchangeable object with the other one of said supports, such that both said exchangeable object handling apparatus and said additional exchangeable object handling apparatus each comprise a manipulator and an intermediate holding device.

34. The lithographic apparatus of claim 30, wherein said intermediate holding device is configured to place an exchangeable object on said manipulator.

35. An exchangeable object handling apparatus configured to exchange an exchangeable object on a support in a lithographic apparatus, said exchangeable object handling apparatus comprising:
(i) a manipulator; and
(ii) an intermediate holding device,
wherein said manipulator is configured to exchange said exchangeable object with said support, said intermediate holding device and an exchangeable object station, and
wherein said intermediate holding device is positioned substantially closer to said support than said exchangeable object station.

* * * * *